(12) United States Patent
Jeon (10) Patent No.: US 9,219,104 B2
(45) Date of Patent: Dec. 22, 2015

(54) SELF-EMISSIVE DISPLAY AND MANUFACTURING METHOD THEREOF

(71) Applicant: Samsung Display Co., Ltd., Gyeonggi-do (KR)

(72) Inventor: Hee-Chul Jeon, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/321,575

(22) Filed: Jul. 1, 2014

(65) Prior Publication Data

US 2015/0179708 A1  Jun. 25, 2015

(30) Foreign Application Priority Data

Dec. 20, 2013  (KR) .................. 10-2013-0160254

(51) Int. Cl.
*H01L 27/32* (2006.01)
*H01L 51/56* (2006.01)

(52) U.S. Cl.
CPC .............. *H01L 27/326* (2013.01); *H01L 51/56* (2013.01); *H01L 2227/323* (2013.01)

(58) Field of Classification Search
CPC .. H01L 27/326; H01L 51/56; H01L 2227/323
See application file for complete search history.

(56) References Cited

U.S. PATENT DOCUMENTS

| 2009/0194780 A1 | 8/2009 | Kwon |
| 2010/0309172 A1 | 12/2010 | Oh et al. |
| 2013/0234126 A1* | 9/2013 | Nakatani .................. 257/40 |

FOREIGN PATENT DOCUMENTS

| KR | 10-0708734 B1 | 4/2007 |
| KR | 10-0739651 B1 | 7/2007 |
| KR | 10-2009-0084202 A | 8/2009 |
| KR | 10-2010-0132155 A | 12/2010 |

* cited by examiner

*Primary Examiner* — Anne Hines
(74) *Attorney, Agent, or Firm* — Knobbe, Martens, Olson & Bear, LLP

(57) ABSTRACT

A self-emissive display and manufacturing method thereof are disclosed. In one aspect, the device includes a substrate, a first electrode formed over the substrate, and a pixel defining layer (PDL) formed above at least an end portion of the first electrode, wherein the PDL defines a light emission area and a non-emission area. A light-emitting layer is formed over the first electrode in the light emission area and a second electrode is formed over the light-emitting layer. A protrusion is formed in the PDL in an area over the end portion of the first electrode.

22 Claims, 10 Drawing Sheets

SELF-EMISSIVE DISPLAY AND MANUFACTURING METHOD THEREOF

CROSS-REFERENCE TO RELATED APPLICATIONS

This application claims priority to and the benefit of Korean Patent Application No. 10-2013-0160254, filed on Dec. 20, 2013, with the Korean Intellectual Property Office, the disclosure of which is incorporated herein in its entirety by reference.

BACKGROUND

1. Field

The described technology generally relates to a self-emissive display and a manufacturing method thereof.

2. Description of the Related Technology

Display devices include a plurality of pixels, each including a light-emitting area defined by a black matrix or a pixel defining layer. According to the emission technology employed, display devices can be categorized into liquid crystal displays (LCD), organic light-emitting diode (OLED) displays, plasma display panels (PDPs), and electrophoretic displays (EPDs).

OLED displays are self-emissive displays that emit light by combining electrons and holes in an organic material. OLED displays are typically classified into two categories, passive-matrix OLED displays and active-matrix OLED displays, according to the driving technology. Active-matrix OLED displays includes a switching element such as a thin film transistor (TFT) in each pixel so as to control light emission by the pixel.

OLED displays include a display substrate. The display substrate includes a display area including a plurality of pixels and a non-display area including wires for applying signals and driving voltages to each pixel. The non-display area also includes a sealing area coated with a sealant for bonding a lower substrate to an upper substrate.

SUMMARY OF CERTAIN INVENTIVE ASPECTS

One inventive aspect is a self-emissive display including a pixel defining layer having a protrusion and a manufacturing method thereof.

Another aspect is a display device that can prevent a photoresist or photosensitive material from remaining in contact holes of a sealing area after an exposure process and can also prevent the size of an emission area from increasing due to high intensity light exposure, and to a manufacturing method of the display device.

Another aspect is a display device including a substrate, a first electrode on the substrate, a pixel defining layer (PDL) overlapping an end portion of the first electrode and partitioning the first electrode into an emission area and a non-emission area, a light-emitting layer on the emission area of the first electrode partitioned by the PDL, a second electrode on the light-emitting layer, and a protrusion on an area where the PDL and the end portion of the first electrode overlap each other.

The protrusion may be provided along an edge portion of the emission area.

The protrusion may have a width of about 1 μm to about 5 μm.

The protrusion may have a height of about 1 μm to about 5 μm.

The protrusion may include one or more of polyacrylate resin, epoxy resin, phenolic resin, polyamide resin, polyimide resin, unsaturated polyester resin, polyphenylene ether resin, polyphenylene sulfide resin, and benzocyclobutene (BCB).

The PDL may be formed of the same material as the protrusion.

Another aspect is a method of manufacturing a display device including forming a thin film transistor (TFT) on a substrate, forming a planarization layer on the substrate where the TFT is formed, the planarization layer being provided with a via hole exposing a portion of a drain electrode of the TFT, forming a first electrode on the planarization layer, forming a pixel defining layer (PDL) on the first electrode, the PDL partitioning the first electrode into an emission area and a non-emission area, forming a light-emitting layer on the emission area of the first electrode, and forming a second electrode on the light-emitting layer, wherein the forming of the PDL includes coating a PDL material on the substrate where the first electrode is formed, coating a protrusion material on an area corresponding to an end portion of the first electrode on the PDL material, and forming the PDL and a protrusion by exposing the emission area of the first electrode to light.

The protrusion may be formed along an edge portion of the emission area.

The protrusion may be formed to have a width of about 1 μm to about 5 μm.

The protrusion may be formed to have a height of about 1 μm to about 5 μm.

The protrusion material may include one or more of polyacrylate resin, epoxy resin, phenolic resin, polyamide resin, polyimide resin, unsaturated polyester resin, polyphenylene ether resin, polyphenylene sulfide resin, and benzocyclobutene (BCB).

The PDL may be formed of the same material as the protrusion.

Another aspect is a self-emissive display including a substrate, a first electrode formed over the substrate, a pixel defining layer (PDL) formed above at least an end portion of the first electrode, wherein the PDL defines a light emission area and a non-emission area, a light-emitting layer formed over the first electrode in the light emission area, and a second electrode formed over the light-emitting layer, wherein a protrusion is formed in the PDL in an area over the end portion of the first electrode.

The protrusion is formed along an edge portion of the light emission area. The protrusion surrounds the light emission area. The protrusion has a width of about 1 μm to about 5 μm. The protrusion has a height of about 1 μm to about 5 μm. The protrusion is formed of one or more of polyacrylate resin, epoxy resin, phenolic resin, polyamide resin, polyimide resin, unsaturated polyester resin, polyphenylene ether resin, polyphenylene sulfide resin, and benzocyclobutene (BCB). The PDL is formed of the same material as the protrusion. The self-emissive display is an organic light-emitting diode (OLED) display. The protrusion overlaps the end portion of the first electrode in a direction perpendicular to the substrate.

Another aspect is a method of manufacturing a self-emissive display, the method including forming a thin film transistor (TFT) over a substrate, wherein the TFT includes a drain electrode, forming a planarization layer over the TFT, forming a via hole in the planarization layer so as to expose a portion of the drain electrode, forming a first electrode over the planarization layer, forming a pixel defining layer (PDL) over the first electrode, wherein the PDL defines a light emission area and a non-emission area, forming a light-emitting layer over the first electrode in the light emission area, and forming a second electrode over the light-emitting layer, wherein the forming of the PDL includes forming a PDL material on the substrate and the first electrode, forming a protrusion material on the PDL material above at least an end portion of the first electrode, and exposing the PDL material to light in the light emission area.

The protrusion is formed along an edge portion of the light emission area. The protrusion surrounds the light emission area. The protrusion has a width of about 1 μm to about 5 μm. The protrusion has a height of about 1 μm to about 5 μm. The protrusion material includes one or more of polyacrylate resin, epoxy resin, phenolic resin, polyamide resin, polyimide resin, unsaturated polyester resin, polyphenylene ether resin, polyphenylene sulfide resin, and benzocyclobutene (BCB). The PDL is formed of the same material as the protrusion.

Another aspect is a self-emissive display including a substrate including a display area and a sealing area surrounding the display area, a plurality of pixels formed in the display area, wherein each of the pixels includes a pixel electrode and a light-emitting layer formed over the pixel electrode, a pixel defining layer (PDL) formed in the display area, wherein the PDL defines i) a light emission area in each of the pixels and ii) a non-emission area, and an insulating layer formed in the display area and the sealing area, wherein a plurality of openings are formed in the insulating layer in the sealing area, wherein a protrusion is formed in the PDL in each of the pixels and wherein each of the protrusions is formed above at least an end portion of the corresponding pixel electrode.

Each of the protrusions surrounds the corresponding light emission area. Each of the protrusions is formed along an edge portion of the corresponding light emission area. The display further includes a common electrode formed over the light-emitting layers, wherein each of the protrusions overlaps end portions of the common electrode. Each of the protrusions has a width of about 1 μm to about 5 μm. Each of the protrusions has a height of about 1 μm to about 5 μm.

According to at least one embodiment, the display device and the manufacturing method thereof can prevent a photoresist or photosensitive material from remaining in contact holes of a sealing area and also prevent the size of an emission area from increasing due to high intensity light exposure.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF CERTAIN INVENTIVE EMBODIMENTS

Recently, there has been a growing demand for OLED displays with non-display areas having a reduced size. This size reduction limits the available space for the sealing area and can result in an insufficient bond between the sealant and the substrate. In order to improve the adhesion between the substrate and the sealant in the sealing area, a plurality of contact holes can be formed in the sealing area to increase the contact area. However, when the sealing area has a plurality of contact holes, a photoresist or a photosensitive material coated on the substrate as part of the OLED display manufacturing process may remain in the contact holes. In other words, the photoresist or the photosensitive material may remain in the contact holes due to a lack of exposure to light of a sufficient intensity. The structure and shape of the contact holes leads to a decrease in the intensity of light incident on the material coated in the contact holes.

When the light intensity is increased to expose the photoresist or photosensitive material in the contact holes to a sufficient level, the residual photoresist or photosensitive material is removed from the contact holes. However, this increase in intensity also increases the exposure in other areas, e.g., an emission area. This can increase the size of the emission area beyond the desired size.

Hereinafter, embodiments of the described technology will be described in more detail with reference to the accompanying drawings.

Although the described technology can be modified in various manners and has several embodiments, specific embodiments are illustrated in the accompanying drawings and will be mainly described in the specification. However, the scope of the described technology is not limited to the specific embodiments and should be construed as including all the changes, equivalents, and substitutions included in the spirit and scope of the described technology.

It will be understood that when an element such as a layer, film, region, or substrate is referred to as being "on", "connected to," or "coupled to" another element or layer, it can be directly on, connected, or coupled to the other element or layer or intervening elements or layers may also be present. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that, although the terms "first," "second," and "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Some of the components which are not directly associated with the description may not be provided in order to specifically describe embodiments of the described technology. Like reference numerals refer to like elements throughout the specification. The term "substantially" as used in this disclosure means completely, almost completely, or to any significant degree.

Figure 1:
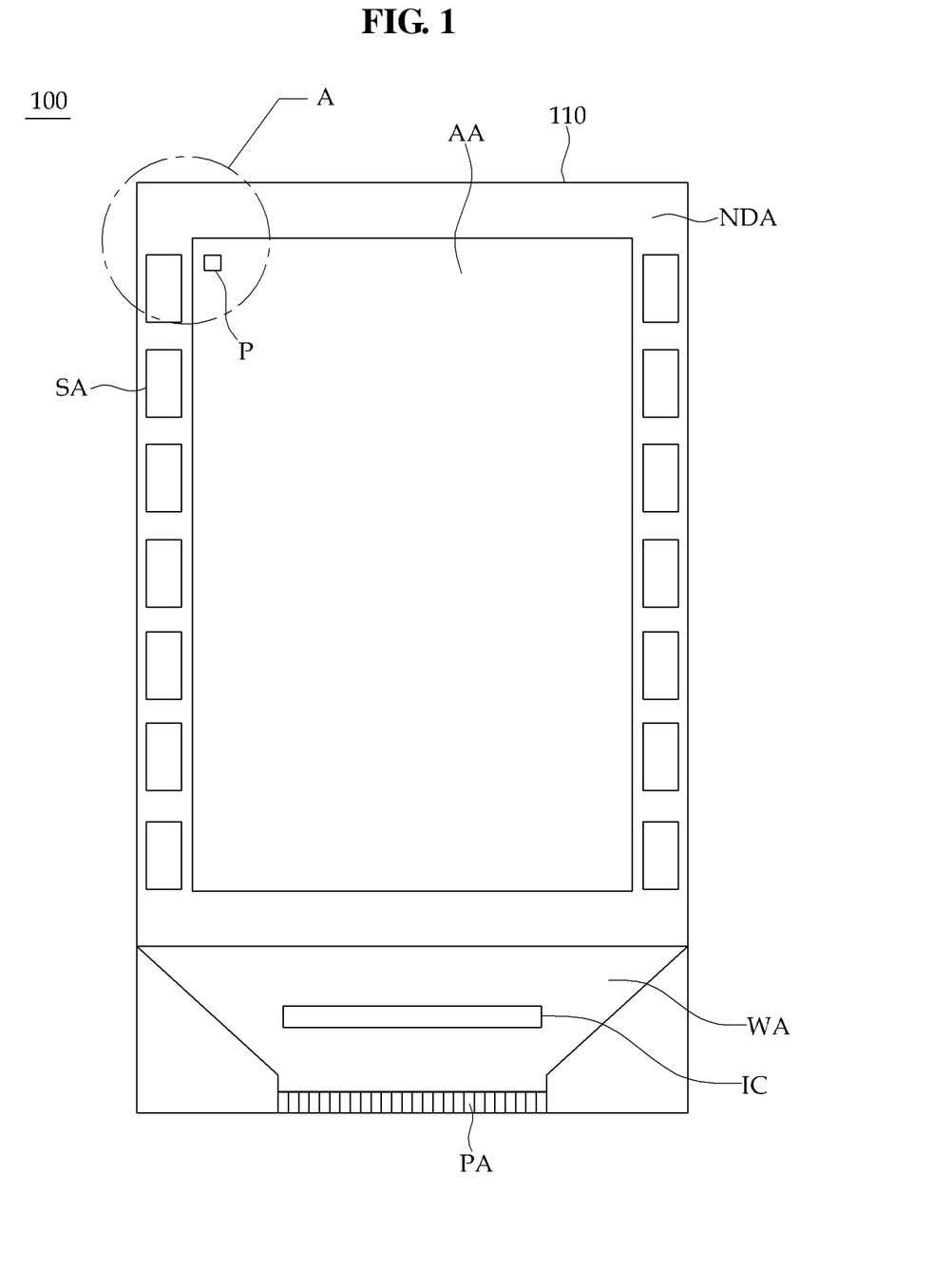
FIG. 1 is a schematic plan view showing a standard display device.

FIG. 1 is a schematic plan view showing a standard display device. Referring to FIG. 1, the standard display device 100 includes a substrate 110 and the substrate 110 includes an active area or display area AA where an image is displayed and a non-display area NDA surrounding the active area AA.

The active area AA includes a plurality of pixels P arranged in a matrix. The pixels P respectively receive data signals, scan signals, and a driving voltage through a plurality of data lines, a plurality of scan lines, and a plurality of power source lines, which are included in a wire area WA.

Figure 2:
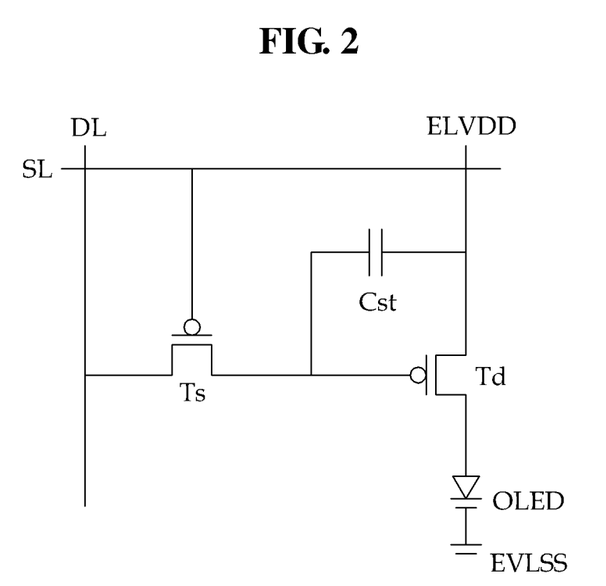
FIG. 2 is a circuit diagram showing a pixel of the standard display device of FIG. 1.

FIG. 2 is a circuit diagram showing a pixel P of the standard display device of FIG. 1. Referring to FIG. 2, the pixel P includes a switching transistor $T_s$ that is turned on by the scan signals applied by the scan lines SL so as to transmit the data signals. The pixel P also includes a storage capacitor $C_{st}$ configured to store the data signals and a driving transistor $T_d$ configured to drive an organic light-emitting diode (OLED) in accordance with the data signals.

The pixel P is illustrated as having a 2Tr1C (two transistors and one capacitor) configuration in FIG. 2, but the described technology is not limited thereto. The pixel P may further include an additional transistor configured to compensate for the threshold voltage of the driving transistor $T_d$ or initialize the driving transistor $T_d$, and a compensation circuit for driving the additional transistor. The transistors included in the pixel P are PMOS transistors according to an embodiment, but the described technology is not limited thereto. The transistors included in the pixel P can also be NMOS transistors.

Referring back to FIG. 1, the non-display area NDA includes the wire area WA. The wire area WA includes a plurality of wires configured to supply a plurality of driving signals and a plurality of driving voltages, received from an external source through a pad area PA, to the active area AA. The wire area WA also includes a data driver integrated circuit (IC) configured to apply the data signals to the active area AA. The non-display area NDA further includes a sealing area SA coated with a sealant so as to bond the substrate 110 and encapsulation glass together.

Figure 3:
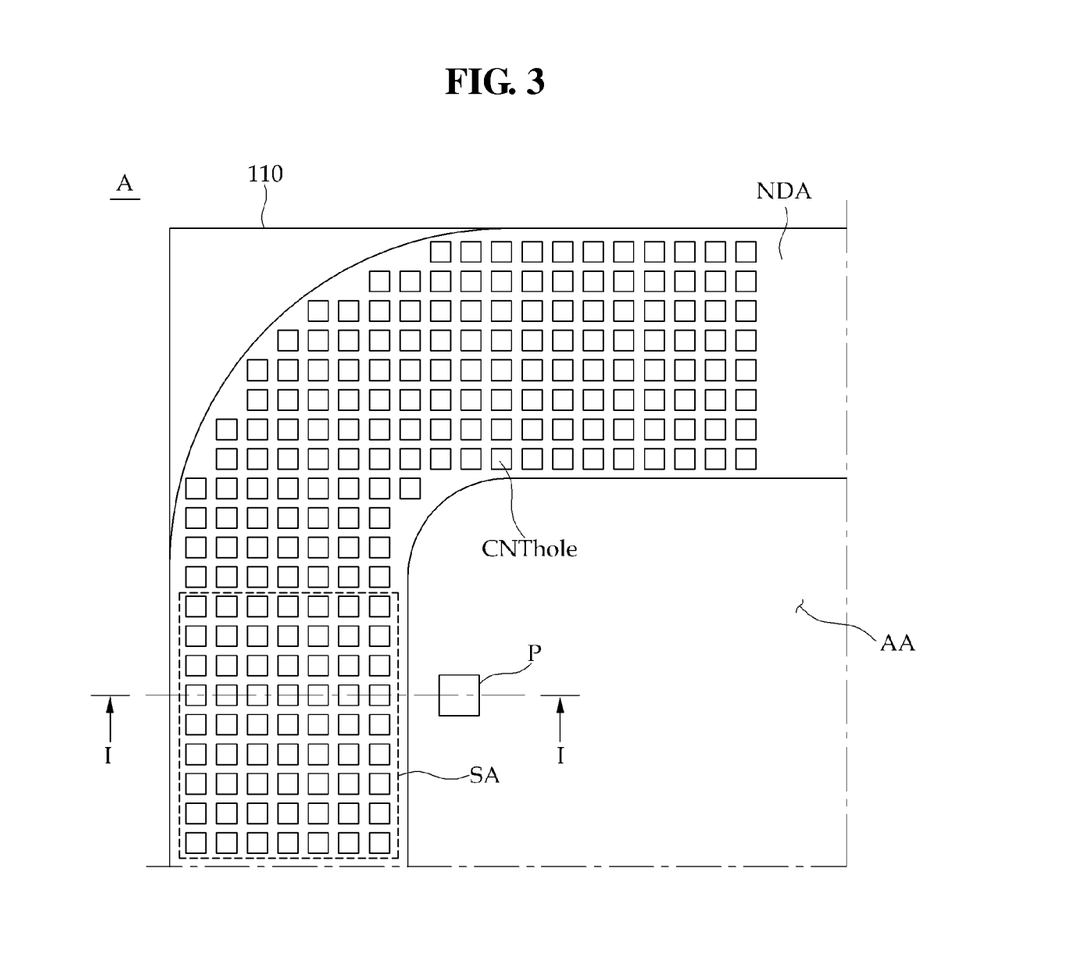
FIG. 3 is a partially enlarged view of the area A of the standard display device of FIG. 1.

FIG. 3 is a partially enlarged view of the area A of the standard display device 100 of FIG. 1. Referring to FIG. 3, the sealing area SA in the non-display area NDA includes a plurality of contact holes or openings (CNT holes). The contact holes provide a larger contact area between the sealant and the substrate 110 so that the sealant and the substrate 110 can be more effectively boned to each other.

Figure 4:
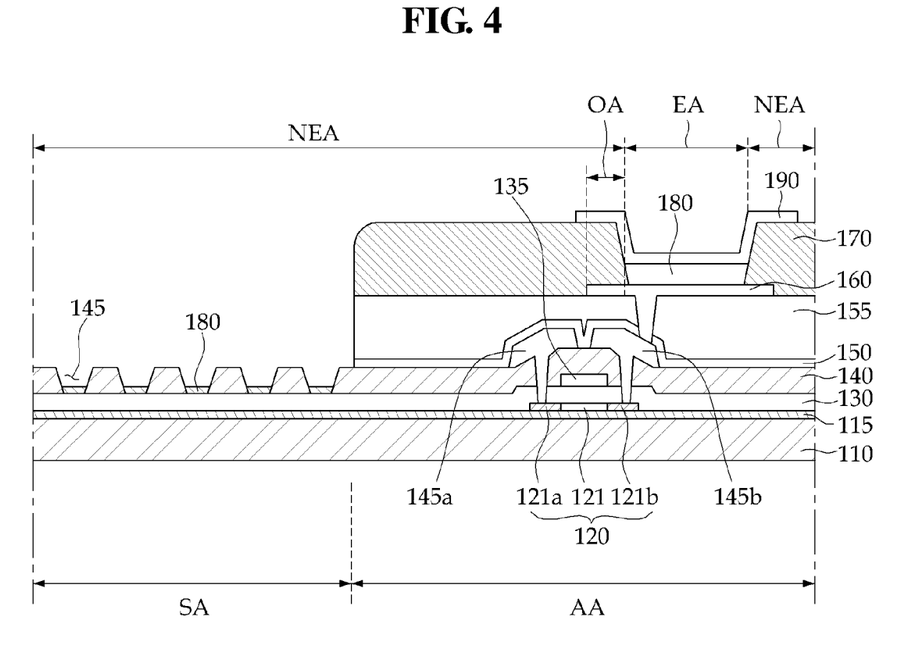
FIGS. 4 and 5 are cross-sectional views taken along line I-I of FIG. 3.
Figure 5:
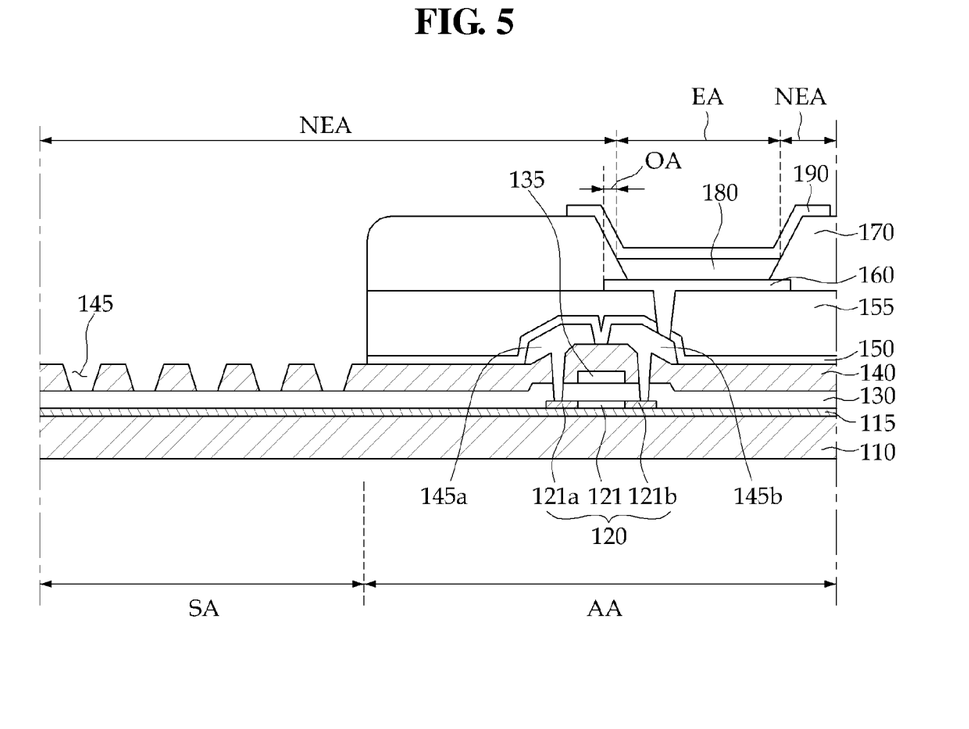

FIGS. 4 and 5 are cross-sectional views taken along line I-I of FIG. 3. Referring to FIGS. 4 and 5, the standard display device 100 includes the active area AA and the sealing area SA.

The active area AA of the standard display device 100 includes the substrate 110, a buffer layer 115 on the substrate 110, a semiconductor layer 120 on the buffer layer 115, and a gate insulating layer 130 on the semiconductor layer 120. The display device 100 also includes a gate electrode 135 on the gate insulating layer 130, an interlayer insulating layer 140 on the gate electrode 135, and source and drain electrodes 145a and 145b respectively electrically connected to source and drain regions 121a and 121b of the semiconductor layer 120 through the gate insulating layer 130 and the interlayer insulating layer 140. The display device 100 further includes a protective layer 150 on the source and drain electrodes 145a and 145b, a planarization layer 155 on the protective layer 150, and a first electrode 160 on the planarization layer 155 and electrically connected to the drain electrode 145b through the protective layer 150 and the planarization layer 155. A pixel defining layer (PDL) 170 is formed on the first electrode 160 and partitions the first electrode 160 into an emission area EA and a non-emission area NEA. A light-emitting layer 180 is formed on the emission area EA of the first electrode 160 and a second electrode 190 is formed on the light-emitting layer 180. In some embodiments, the second electrode 190 is a common electrode formed commonly over all of the pixels P.

The sealing area SA of the standard display device 100 includes the substrate 110, the buffer layer 115 on the substrate 110, the gate insulating layer 130 on the buffer layer 115, and the interlayer insulating layer 140 on the gate insulating layer 130. A plurality of contact holes 145 are formed in the interlayer insulating layer 140.

In some embodiments, the PDL 170 is formed by coating a PDL material (not shown) over substantially the entire the substrate 110 including over the first electrode 160, and thereafter the PDL material is removed from the emission area EA and the sealing area SA by a process such as photolithography.

The PDL material can be a photoresist or a photosensitive material. In other words, the PDL can be patterned by developing the PDL material after exposure using a mask. Hereinafter, the PDL material will be described as a positive photoresist in which an exposed area is removed during the developing process.

Meanwhile, the PDL material coated on the sealing area SA is not completely removed from the contact holes 145, and as illustrated in FIG. 4, a portion of the PDL material remains in the contact holes 145. The PDL material is not completely removed from the contact holes due to a lack of light intensity resulting from the position of the sealing area SA and the structure and shape of the contact holes 145 in the sealing area SA.

As described above, when the PDL material remains in the contact holes 145, the sealant formed on the sealing area SA may have lower adhesion strength due to the remaining PDL material.

Further, when the light intensity of the exposure is increased to remove all of the residual PDL material from the contact holes 145 of the sealing area SA, as illustrated in FIG. 5, all of the PDL material is removed from the contact holes 145 in the sealing area SA. However, the light intensity of the exposure in the emission area EA also increases.

Due to the increased light intensity, the size of emission area EA increases and an overlapping area OA between the first electrode 160 and the PDL 170 is reduced. When the overlapping area OA decreases, the light-emitting layer 180 can be broken or shattered by an electric field generated between the first electrode 160 and the second electrode 190, thereby causing short circuits between the electrodes. Such short circuits can result in dark spots in the display device 100.

According to at least one embodiment, the display device does not have the PDL material remaining in the contact holes of the sealing area SA and the size of the emission area EA is not substantially increased from a higher light intensity.

Figure 6:
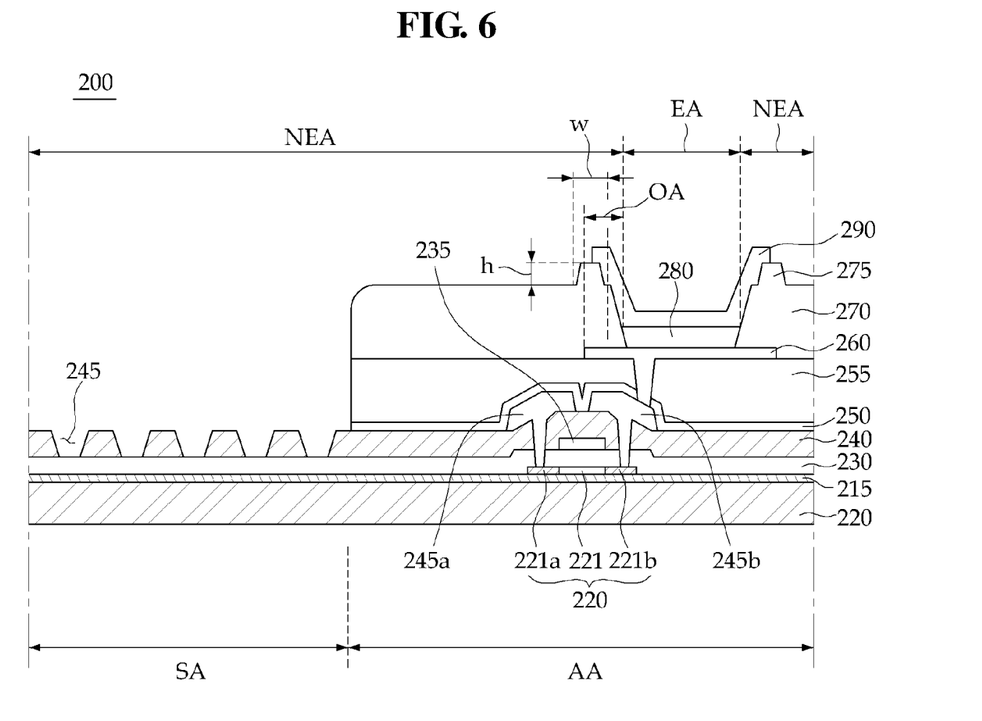
FIG. 6 is a cross-sectional view of a display device according to an embodiment.

FIG. 6 is a cross-sectional view of a display device according to an embodiment. Referring to FIG. 6, the display device 200 includes an active area AA and a sealing area SA.

The active area AA of the display device 200 includes a substrate 210, a buffer layer 215 on the substrate 210, a semiconductor layer 220 on the buffer layer 215, and a gate insulating layer 230 on the semiconductor layer 220. The display device 200 also includes a gate electrode 235 on the gate insulating layer 230, an interlayer insulating layer 240 on the gate electrode 235, and source and drain electrodes 245a and 245b respectively electrically connected to source and drain regions 221a and 221b of the semiconductor layer 220 through the gate insulating layer 230 and the interlayer insulating layer 240. The display device 200 further includes a protective layer 250 on the source and drain electrodes 245a and 245b, a planarization layer 255 on the protective layer 250, and a first electrode or a pixel electrode 260 on the planarization layer 255 and electrically connected to the drain electrode 245b through the protective layer 250 and the planarization layer 255. A pixel defining layer (PDL) 270 is formed on the first electrode 260 and partitions the first electrode 260 into an emission area EA and a non-emission area NEA. A protrusion 275 is formed in the PDL 270. A light-emitting layer 280 is formed on the emission area EA of the first electrode 260 and a second electrode 290 is formed on the light-emitting layer 280.

The sealing area SA of the display device 200 includes the substrate 210, the buffer layer 215 on the substrate 210, the gate insulating layer 230 on the buffer layer 215, and the interlayer insulating layer 240 on the gate insulating layer 230. The interlayer insulating layer 240 has a plurality of contact holes or openings 245.

The substrate 210 may include glass, quartz, ceramic, plastic, or a combination thereof. The plastic substrate may include, for example, polyimide resin, acrylic resin, polyacrylate resin, polycarbonate resin, polyether resin, polyethylene terephthalate resin, sulfonic acid resin, or a combination thereof. In addition, the plastic substrate may include metals such as stainless steel.

The buffer layer 215 may include silicon compounds and may have a single layer or multilayer structure. The buffer layer 215 planarizes the upper surface of the substrate 210 and substantially prevents the penetration of undesirable elements, e.g., impurities or moisture through the substrate 210. However, according to embodiments, the buffer layer 215 is not always necessary and may not be provided according to type and properties of the substrate 210.

The semiconductor layer 220 includes a channel area or channel region 221 and the source and drain regions 221a and 221b on opposing sides of the channel area 221. The channel area 221 is a polycrystalline silicon layer that is not doped with impurities and the source and drain regions 221a and 221b are polycrystalline silicon layers doped with impurities. The semiconductor layer 220 can be classified as an a n-type semiconductor doped with, for example, phosphorus (P) or a p-type semiconductor doped with, for example, boron (B) according to the impurities used in doping the source and drain regions 221a and 221b.

The gate electrode 235, the source electrode 245a, and the drain electrode 245b may include metals, alloys, metal nitride, conductive metal oxide, transparent conductive materials, or combinations thereof. The gate electrode 235, the source electrode 245a, and the drain electrode 245b may include, for example, aluminum (Al), silver (Ag), tungsten (W), copper (Cu), nickel (Ni), chromium (Cr), molybdenum (Mo), titanium (Ti), platinum (Pt), tantalum (Ta), and alloys thereof, aluminum nitride (AlNx), tungsten nitride (WNx), chromium nitride (CrNx), titanium nitride (TiNx), tantalum nitride (TaNx), zinc oxide (ZnOx), indium tin oxide (ITO), tin oxide (SnOx), indium oxide (InOx), gallium oxide (GaOx), or indium zinc oxide (IZO), which may be used alone or in combination with each other.

The gate insulating layer 230, the interlayer insulating layer 240, the protective layer 250, and the planarization layer 255 may include silicon nitride (SiNx), silicon oxide (SiOx), hafnium oxide (HfOx), aluminum oxide (AlOx), yttrium oxide (YOx), or tantalum oxide (TaOx), which may be used alone or in combination with each other.

When the display device 200 is a bottom emission display, the first electrode 260 is a transparent electrode and the second electrode 290 is a reflective electrode. Similarly, when the display device 200 is a top emission display, the first electrode 260 is a reflective electrode and the second electrode 290 is a transparent electrode.

The transparent electrode may include one or more material selected from the group of indium tin oxide (ITO), indium zinc oxide (IZO), tin oxide (TO), and zinc oxide (ZnO). The reflective electrode may include one or more material selected from the group of silver (Ag), magnesium (Mg), aluminum (Al), platinum (Pt), palladium (Pd), gold (Au), nickel (Ni), neodymium (Nd), iridium (Ir), and chromium (Cr).

The light-emitting layer 280 may include a red, green, or blue light-emitting layer that respectively include red, green, or blue light-emitting material based on the color of the pixel. The light-emitting layer 280 may further include a hole injection layer (HIL) and a hole transport layer (HTL) for fluid hole injection into the light-emitting layer 280 and an electron transport layer (ETL) and an electron injection layer (EIL) for fluid electron injection.

The PDL 270 may include one or more material selected from the group of polyacrylate resin, epoxy resin, phenolic resin, polyamide resin, polyimide resin, unsaturated polyester resin, polyphenylene ether resin, polyphenylene sulfide resin, and benzocyclobutene (BCB).

The PDL 270 may include a positive photoresist or a negative photoresist. A positive photoresist is a material which softens when exposed to light in a photolithography process and thus the light-exposed portion can be removed. A negative photoresist is a material which hardens when exposed to light in a photolithography process, and thus non-exposed portions can be removed. Hereinafter, an embodiment of the PDL 270 will be described as a positive photoresist for ease of description.

The PDL 270 is formed on the first electrode 260 and substantially overlaps an end portion of the first electrode 260. The protrusion 275 is formed in an area of the PDL 270 overlapping the first electrode 260. In other words, the PDL 270 has the protrusion 275 over the end portion of the first electrode 260. The protrusion 275 may be formed of the same material as the PDL 270. Referring to FIG. 6, the protrusion 275 has a substantially trapezoidal shape, but is not limited thereto. In other embodiments, the protrusion 275 has a substantially domical shape or a substantially quadrilateral shape.

The protrusion 275 may have a width w of about 1 μm to about 5 μm, but it is not limited thereto. Further, the protrusion 275 may have a height h of about 1 μm to about 5 μm, but it is not limited thereto. The protrusion 275 can be formed on the PDL 270. According to embodiments, the height of the protrusion is less than a spacer that controls cell gap. Depending on the embodiment, the width w of the protrusion 275 can be less than about 1 μm or greater than about 5 μm and the height h of the protrusion 275 can be less than about 1 μm or greater than about 5 μm.

Figure 7:
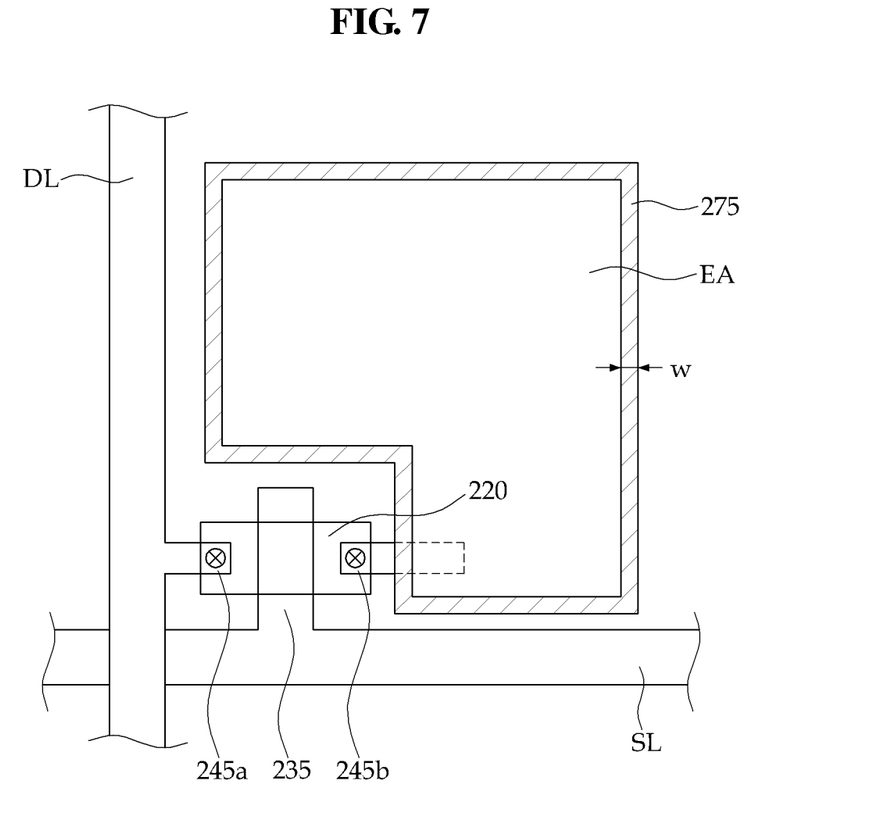
FIG. 7 is a plan view illustrating a display device according to an embodiment.

FIG. 7 is a plan view illustrating a display device according to an embodiment. As illustrated in FIG. 7, the protrusion 275 is formed along an edge portion of the emission area EA and has a predetermined width w. The protrusion 275 surrounds the emission area EA.

FIGS. 8 to 11 are cross-sectional views of a method of manufacturing a display device according to an embodiment.

According to the embodiment of FIGS. 8 to 11, the method includes forming a thin film transistor (TFT) on a substrate, forming a first electrode connected to a drain electrode of the TFT, and forming a pixel defining layer (PDL) on the first electrode. The PDL is formed to partition the first electrode into an emission area and a non-emission area. The method also includes forming a light-emitting layer on the emission area of the first electrode and forming a second electrode on the light-emitting layer.

Figure 8:
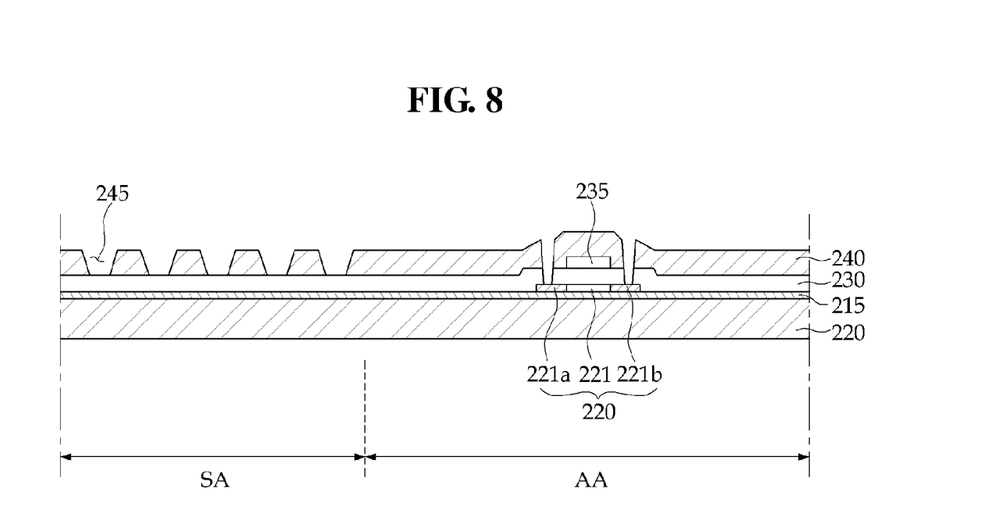
FIGS. 8 to 11 are cross-sectional views of a method of manufacturing a display device according to an embodiment.

Referring to FIG. 8, the TFT is formed in an active area AA of the substrate 210 and a plurality of contact holes 245 are formed in a sealing area SA of the substrate 210.

First, a buffer layer 215 is formed on the substrate 210. The buffer layer 215 may be formed by using silicon compounds. For example, the buffer layer 215 may include one or more material selected from the group of silicon oxide, silicon nitride, silicon oxynitride, silicon carbonitride, and silicon oxycarbide.

A semiconductor layer 220 is formed on the buffer layer 215. The semiconductor layer 220 may be formed by coating a semiconductor material, patterning and then crystallizing the semiconductor material. The semiconductor layer 220 may be formed by using a chemical vapor deposition process or a sputtering process. The crystallization process may include a laser irradiation process, a heat treatment process, or the like.

A gate insulating layer 230 is formed on the substrate 210 where the semiconductor layer 220 is formed. The gate insulating layer 230 may include one or more material selected from the group of silicon nitride (SiNx), silicon oxide (SiOx), hafnium oxide (HfOx), aluminum oxide (AlOx), yttrium oxide (YOx), and tantalum oxide (TaOx). The gate insulating layer 230 may be formed by using a chemical vapor deposition process, a spin coating process, a sputtering process, a vacuum deposition process, a printing process, or the like.

A gate electrode 235 is formed on the gate insulating layer 230. The gate electrode 235 may be formed by coating a gate electrode material on the gate insulating layer 230 and patterning the gate electrode material.

A source region 221a and a drain region 221b are formed in the semiconductor layer 220 by injecting impurities into the semiconductor layer 220 using the gate electrode 235 as an ion-injecting mask. The impurities are not injected into the center portion of the semiconductor layer 220, located under the gate electrode 235, and accordingly the center portion of the semiconductor layer 220 becomes a channel area 221.

An interlayer insulating layer 240 covering the gate electrode 235 is formed on the gate insulating layer 230. The interlayer insulating layer 240 may include one or more material selected form the group of silicon nitride (SiNx), silicon oxide (SiOx), hafnium oxide (HfOx), aluminum oxide (AlOx), yttrium oxide (YOx), and tantalum oxide (TaOx). The interlayer insulating layer 240 may be formed by using a chemical vapor deposition process, a spin coating process, a sputtering process, a vacuum deposition process, a printing process, or the like.

Next, via holes are formed in the gate insulating layer 230 and the interlayer insulating layer 240 to expose the source and drain regions 221a and 221b of the semiconductor layer 220. A plurality of contact holes 245 are also formed in the interlayer insulating layer 240 in the sealing area SA of the substrate 210.

Figure 9:
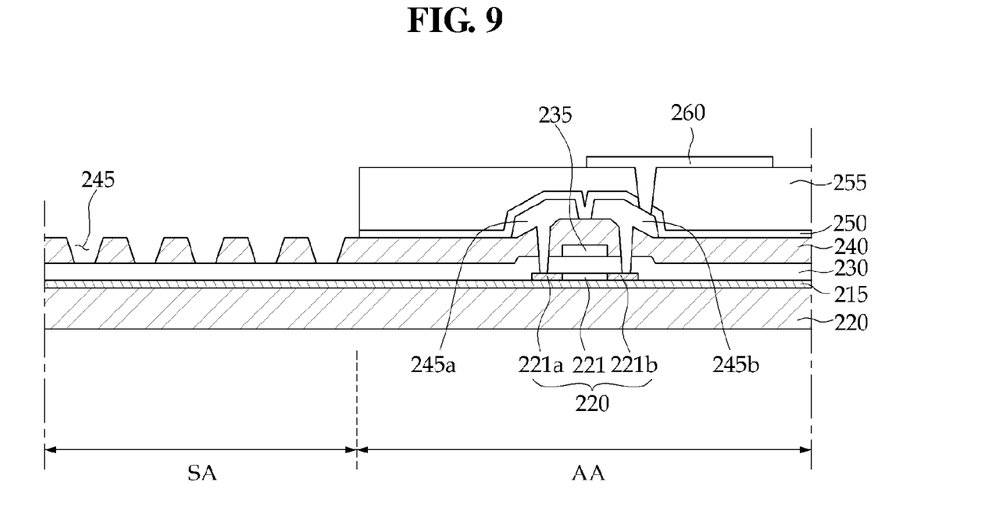

Referring to FIG. 9, in order to fill the via holes, a source electrode material and a drain electrode material are coated and patterned to form a source electrode 245a and a drain electrode 245b.

A protective layer 250 covering the source and drain electrodes 245a and 245b is formed on the interlayer insulating layer and a planarization layer 255 is formed on the protective layer 250. The protective layer 250 and the planarization layer 255 may include one or more material selected from the group of a photoresist, an acryl-based polymer, a polyimide-based polymer, a polyamide-based polymer, a siloxane-based polymer, a photosensitive acrylic polymer including a carboxyl group, a novolac resin, an alkali-soluble resin, silicon nitride (SiNx), silicon oxide (SiOx), hafnium oxide (HfOx), aluminum oxide (AlOx), yttrium oxide (YOx), and tantalum oxide (TaOx). The protective layer 250 and the planarization layer 255 may be formed by using a chemical vapor deposition process, a spin coating process, a sputtering process, a vacuum deposition process, a printing process, or the like.

The first electrode 260 is formed on the planarization layer 255. The first electrode 260 is connected to the drain electrode 245b through the protective layer 250 and the planarization layer 255.

Figure 10:
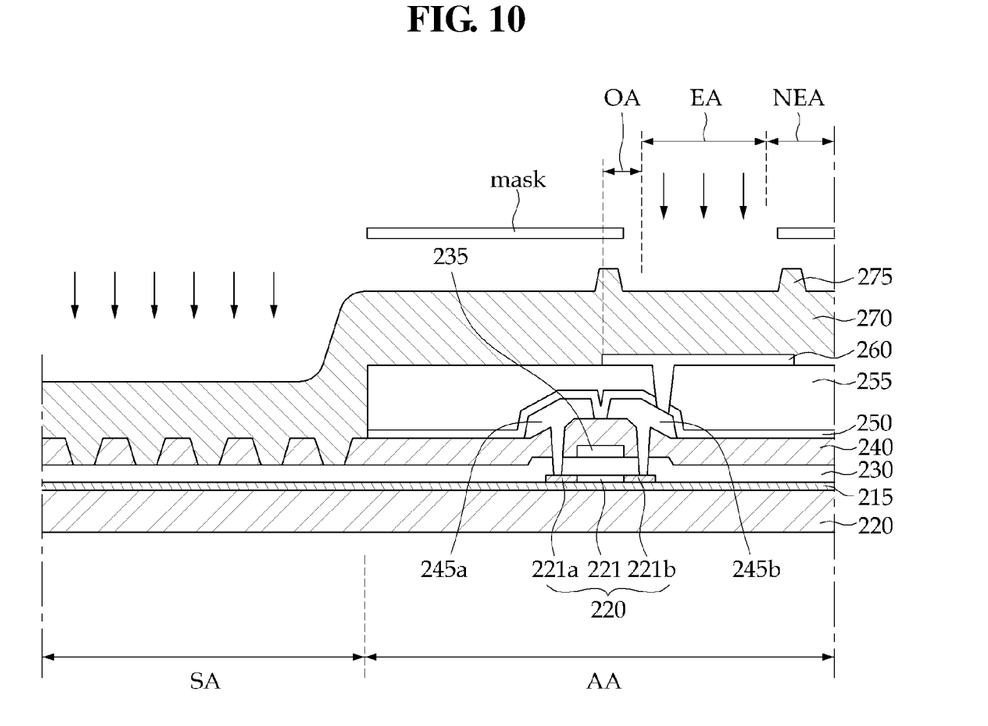

Referring to FIG. 10, the PDL 270 is formed on the substrate 210 where the first electrode 260 is formed. The forming of the PDL 270 includes coating a PDL material on the substrate 210 where the first electrode 260 is formed, forming the protrusion 275 in the PDL material in an area corresponding to an end portion of the first electrode 260, and removing the PDL material from the emission area EA and the sealing area SA by an exposure process.

The protrusion 275 may be formed of the same material as the PDL 270. Referring to FIG. 10, the protrusion 275 has a substantially trapezoidal shape, but is not limited thereto. The protrusion 275 may have a substantially domical shape or a substantially quadrilateral shape.

The protrusion 275 may have a width w of about 1 μm to about 5 μm, but it is not limited thereto. Further, the protrusion 275 may have a height h of about 1 μm to about 5 μm, but it is not limited thereto. The protrusion 275 may be formed on the PDL 270. In some embodiments, the protrusion 275 has a height that is less than the height of a spacer that controls cell gap. Depending on the embodiment, the width w of the protrusion 275 can be less than about 1 μm or greater than about 5 μm and the height h of the protrusion 275 can be less than about 1 μm or greater than about 5 μm.

Figure 11:
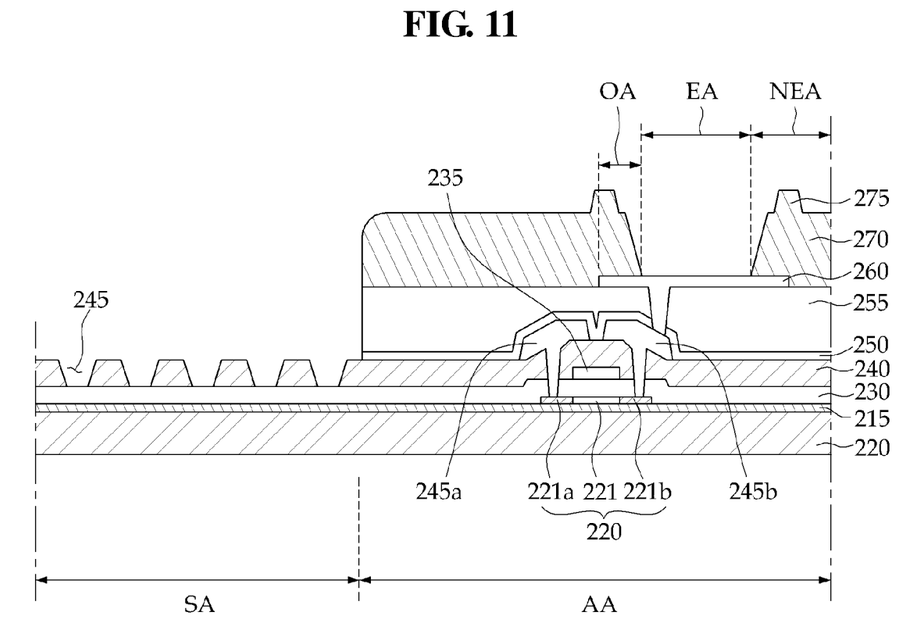

As illustrated in FIG. 11, the exposure process is performed to remove the PDL material from the emission area EA and the sealing area SA. According to at least one embodiment, since the protrusion 275 is formed in an area corresponding to the end portion of the first electrode 260, the overlapping area OA of the first electrode 260 and the PDL 270 does not increase when the light intensity increases in the exposure process. Accordingly, the size of the emission area EA does not increase due to the substantially complete removal of the PDL material from the contact holes 245 in the sealing area SA.

In view of the foregoing, it will be appreciated that various embodiments of the inventive technology have been described herein for purposes of illustration and that various modifications may be made without departing from the scope and spirit of the invention. Accordingly, the various embodiments disclosed herein are not intended to be limiting, with the true scope and spirit being indicated by the following claims, and equivalents thereof.

What is claimed is:
1. A self-emissive display, comprising:
   a substrate including a display area and a sealing area surrounding the display area;
   a first electrode formed over the substrate;
   a pixel defining layer (PDL) formed above at least an end portion of the first electrode, wherein the PDL defines a light emission area and a non-emission area;
   a light-emitting layer formed over the first electrode in the light emission area;

a second electrode formed over the light-emitting layer; and an insulating layer formed in the display area and the sealing area, wherein a plurality of openings are formed in the insulating layer in the sealing area, wherein a protrusion is formed in the PDL in an area over the end portion of the first electrode.

2. The display of claim 1, wherein the protrusion is formed along an edge portion of the light emission area.

3. The display of claim 2, wherein the protrusion surrounds the light emission area.

4. The display of claim 1, wherein the protrusion has a width of about 1 µm to about 5 µm.

5. The display of claim 1, wherein the protrusion has a height of about 1 µm to about 5 µm.

6. The display of claim 1, wherein the protrusion is formed of one or more of polyacrylate resin, epoxy resin, phenolic resin, polyamide resin, polyimide resin, unsaturated polyester resin, polyphenylene ether resin, polyphenylene sulfide resin, and benzocyclobutene (BCB).

7. The display of claim 6, wherein the PDL is formed of the same material as the protrusion.

8. The display of claim 1, wherein the self-emissive display is an organic light-emitting diode (OLED) display.

9. The display of claim 1, wherein the protrusion overlaps the end portion of the first electrode in a direction perpendicular to the substrate.

10. A method of manufacturing a self-emissive display, the method comprising:
forming a thin film transistor (TFT) over a substrate, wherein the TFT includes a drain electrode and wherein the substrate includes a display area and a sealing area surrounding the display area;
forming an insulating layer over the TFT in the display area and the sealing area;
forming a plurality of openings in the insulating layer in the sealing area;
forming a planarization layer over the TFT;
forming a via hole in the planarization layer so as to expose a portion of the Drain electrode;
forming a first electrode over the planarization layer;
forming a pixel defining layer (PDL) over the first electrode, wherein the PDL defines a light emission area and a non-emission area;
forming a light-emitting layer over the first electrode in the light emission area; and
forming a second electrode over the light-emitting layer, wherein the forming of the PDL includes:
forming a PDL material on the substrate and the first electrode;
forming a protrusion material on the PDL material above at least an end portion of the first electrode; and
exposing the PDL material to light in the light emission area.

11. The method of claim 10, wherein the protrusion is formed along an edge portion of the light emission area.

12. The method of claim 11, wherein the protrusion surrounds the light emission area.

13. The method of claim 10, wherein the protrusion has a width of about 1 µm to about 5 µm.

14. The method of claim 10, wherein the protrusion has a height of about 1 µm to about 5 µm.

15. The method of claim 10, wherein the protrusion material includes one or more of polyacrylate resin, epoxy resin, phenolic resin, polyamide resin, polyimide resin, unsaturated polyester resin, polyphenylene ether resin, polyphenylene sulfide resin, and benzocyclobutene (BCB).

16. The method of claim 10, wherein the PDL is formed of the same material as the protrusion.

17. A self-emissive display, comprising:
a substrate including a display area and a sealing area surrounding the display area;
a plurality of pixels formed in the display area, wherein each of the pixels includes a pixel electrode and a light-emitting layer formed over the pixel electrode;
a pixel defining layer (PDL) formed in the display area, wherein the PDL defines i) a light emission area in each of the pixels and ii) a non-emission area; and
an insulating layer formed in the display area and the sealing area, wherein a plurality of openings are formed in the insulating layer in the sealing area,
wherein a protrusion is formed in the PDL in each of the pixels, and
wherein each of the protrusions is formed above at least an end portion of the corresponding pixel electrode.

18. The display of claim 17, wherein each of the protrusions surrounds the corresponding light emission area.

19. The display of claim 18, wherein each of the protrusions is formed along an edge portion of the corresponding light emission area.

20. The display of claim 17, further comprising a common electrode formed over the light-emitting layers, wherein each of the protrusions overlaps end portions of the common electrode.

21. The display of claim 17, wherein each of the protrusions has a width of about 1 µm to about 5 µm.

22. The display of claim 17, wherein each of the protrusions has a height of about 1 µm to about 5 µm.

* * * * *